United States Patent
Williams

Patent Number: 5,614,026
Date of Patent: Mar. 25, 1997

[54] SHOWERHEAD FOR UNIFORM DISTRIBUTION OF PROCESS GAS

[75] Inventor: Norman Williams, Newark, Calif.

[73] Assignee: LAM Research Corporation

[21] Appl. No.: 623,867

[22] Filed: Mar. 29, 1996

[51] Int. Cl.⁶ .................................... C23C 16/00
[52] U.S. Cl. .................... 118/723 ME; 118/723 ER; 427/575
[58] Field of Search ............. 118/723 ME, 723 MR, 118/723 MA, 723 ER, 723 IR, 723 MP; 427/575; 156/345, 643.1; 204/298.33, 298.07, 298.38; 134/1.1

[56] References Cited

U.S. PATENT DOCUMENTS

| | | | |
|---|---|---|---|
| 4,209,357 | 6/1980 | Gorin et al. | 156/345 |
| 4,263,088 | 4/1981 | Gorin | 156/626 |
| 4,579,618 | 4/1986 | Celestino et al. | 156/345 |
| 4,738,748 | 4/1988 | Kisa | 156/643 |
| 4,831,963 | 5/1989 | Saito et al. | 118/723 |
| 4,983,254 | 1/1991 | Fujimura et al. | 156/643 |
| 5,082,517 | 1/1992 | Moslehi | 156/345 |
| 5,102,523 | 4/1992 | Beisswenger et al. | 204/298.33 |
| 5,284,544 | 2/1994 | Mizutani et al. | 156/345 |
| 5,318,654 | 6/1994 | Maruyama et al. | 156/345 |
| 5,445,709 | 8/1995 | Kojima et al. | 216/71 |
| 5,496,410 | 3/1996 | Fukuda et al. | 118/723 MW |
| 5,500,256 | 3/1996 | Watabe | 427/579 |

Primary Examiner—R. Bruce Breneman
Assistant Examiner—Joni Y. Chang
Attorney, Agent, or Firm—Burns, Doane, Swecker & Mathis, L.L.P.

[57] ABSTRACT

A showerhead includes a plurality of gas inlets for supplying process gas to a semiconductor substrate surface, and a plurality of gas outlets for removing gas and volatile byproducts produced as a result of reaction of the process gas with the substrate surface. Each gas inlet is concentrically positioned within a respective gas outlet. The showerhead improves the utilization of process gas species at the substrate surface by providing gas flow in a direction perpendicular to the substrate surface and avoiding flow of the process gas or volatile byproducts laterally across the substrate surface. The showerhead is useful for uniform stripping of a mask of organic material by direct contact of the incoming reactive gas with the substrate surface and immediate removal of the process gas and volatile byproducts through the concentrically arranged gas outlets.

30 Claims, 5 Drawing Sheets

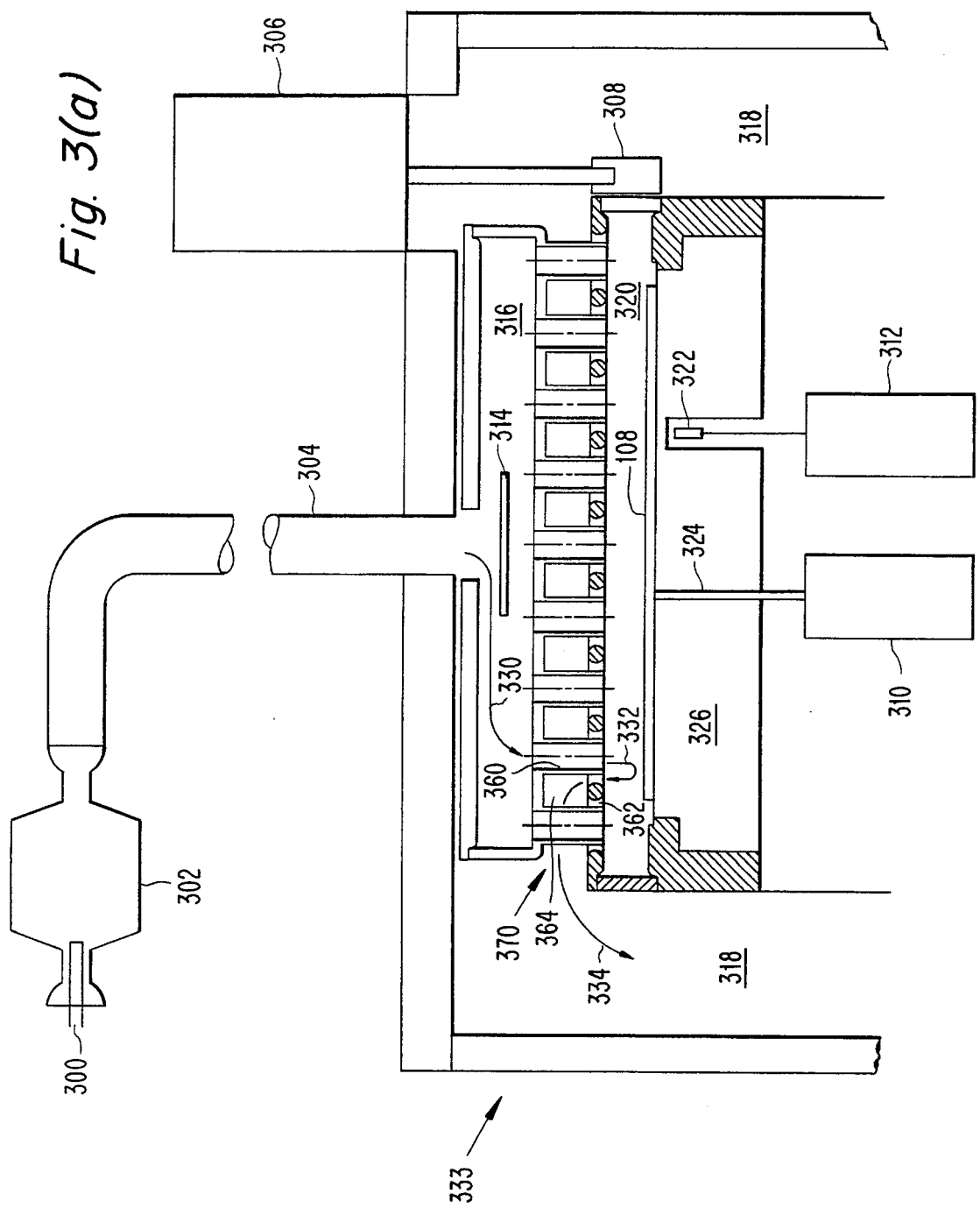

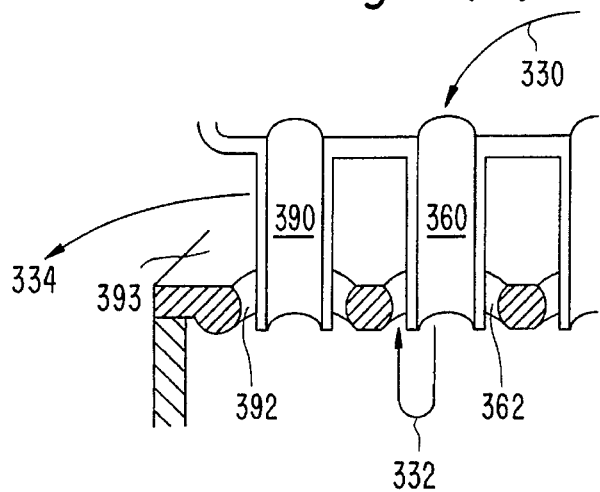
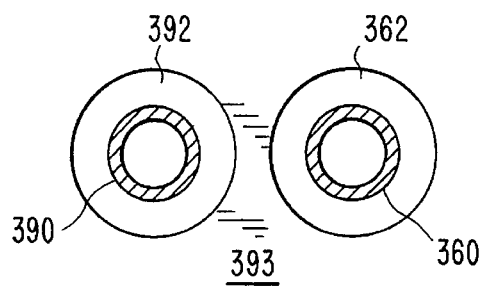
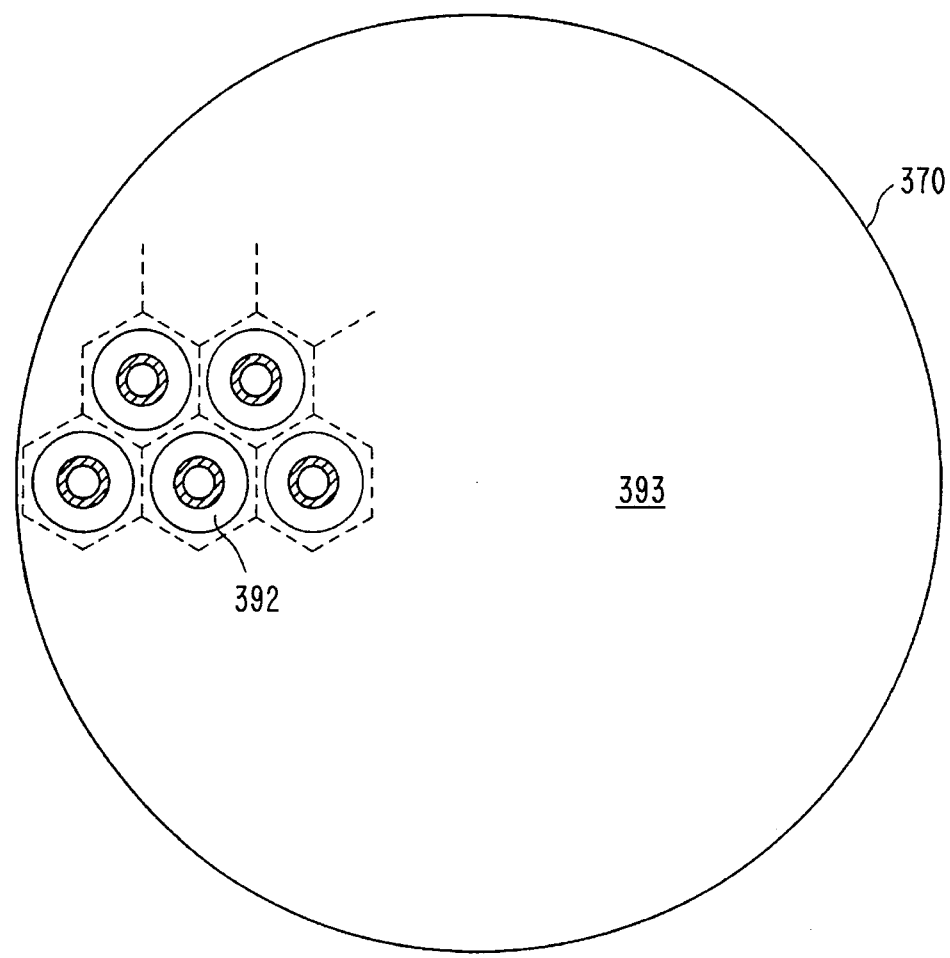

SHOWERHEAD FOR UNIFORM DISTRIBUTION OF PROCESS GAS

FIELD OF THE INVENTION

The present invention relates to a showerhead for uniformly distributing process gas such as chemically reactive gas over a semiconductor substrate surface to enhance species utilization at the substrate surface.

BACKGROUND OF THE INVENTION

Gaseous plasma technology is a well known technique used for the fabrication of integrated circuits. More specifically, plasma technology has been used with great success for thin film etching, deposition of films onto wafers, photoresist stripping, etc.

Despite the widespread acceptance of plasma technology in the semiconductor industry, the use of plasma techniques continues to present a number of challenges. Notably, it has sometimes proven difficult to ensure uniform distribution of reactive gas over a semiconductor wafer during processing. It has been especially problematic to ensure uniform distribution of gas over the semiconductor wafer to accomplish photoresist stripping.

FIG. 1 is illustrative of a prior art process chamber which suffers from non-uniform reactive species distribution. Gas containing active species is passed through a central conduit 102 into a process chamber 104. The gas reacts with the surface of the semiconductor wafer 108 positioned on a platen 116 and then passes out through central exhaust conduit 106. The residence time of the gas in the chamber is typically short (e.g. a few milliseconds). At chamber pressures close to 1 torr and flow rates up to 5 standard liters per minute the Reynolds number is low and the flow is well into the viscous-laminar regime (e.g. Reynolds number "R"<2000). The flow lines are highly ordered over the wafer surface, as illustrated by exemplary flow lines 110 and 112.

As shown in FIG. 1, the inlet 118 of the central conduit 102 is typically positioned directly above the middle portion of the semiconductor wafer 108. As such, the middle portion of the semiconductor wafer receives a disproportionate share of active species, which react and are consumed at the wafer surface. After reacting with the wafer surface, the central stream of gas (e.g. 110) flows radially across the wafer surface and then out through the exhaust conduit 106. This radial flow of gas across the wafer surface precludes outlying streams of gas (e.g. 112) from reaching the wafer surface. It is possible for the active species in these outlying streams of gas to diffuse across the radial flow lines. This diffusion is proportional to the temperature and pressure of the gas. Nevertheless, the short residence time of gas in the chamber usually prohibits a significant amount of diffusion. As a result, the wafer surface is etched at a disproportionate etching rate, e.g., the middle portion of the wafer is etched at a faster rate than the remote edge portion of the wafer.

Practitioners in the art have attempted to mitigate the above noted effect by employing a showerhead to distribute the active species over the semiconductor surface. As shown in FIG. 2, a showerhead 202 is placed between the central conduit inlet 118 and the semiconductor wafer 108. The showerhead typically consists of a plate with a plurality of orifices 220. Gas supplied through the central conduit passes through the plurality of orifices 220, thereby more evenly distributing the application of active species at the surface of the substrate 108.

Yet, in most cases, the prior art showerhead still fails to produce satisfactory uniformity in etching. Gas is eventually pumped through a single exhaust conduit 106. The flow of gas into the conduit 106 creates the same undesirable radial flow 210 of gas across the surface of the wafer, which blocks outlying streams of active species from reaching the wafer surface. Accordingly, the center of the wafer is etched at a faster rate than the rest of the wafer, although not necessarily to the same degree as in the apparatus shown in FIG. 1.

SUMMARY OF THE INVENTION

Accordingly, it is an objective of the present invention to improve the uniformity in the distribution of gas at the substrate surface, and thereby increase the utilization of the active species in the gas.

It is a further objective of the present invention to reduce the radial flow of gas across the surface of the substrate surface, and thereby ensure greater exposure of edge portions of the semiconductor substrate surface to active species in the gas.

These and other objectives of the present invention are achieved according to exemplary embodiments of the present invention by employing an apparatus having an improved showerhead for uniformly distributing process gas over the semiconductor surface. The apparatus includes a gas supply conduit, a plasma generator producing chemically active, gaseous species which generally include ions, radicals and excited atoms and molecules, a gas delivery conduit, a process chamber and an exhaust conduit. The gas supply conduit supplies process gas to be energized into a plasma state. The plasma generator is in fluid communication with the gas supply conduit and energizes process gas supplied from the gas supply conduit into a plasma state and the gas delivery conduit carries the process gas energized in the plasma generator. The process chamber includes a first region in fluid communication with the gas delivery conduit, a second region wherein the substrate is processed, a third region in fluid communication with the second region and through which gas and volatile byproducts are removed from the second region and the showerhead separates the first and second regions. The process gas supplied from the gas delivery conduit passes into the first region, through the showerhead and into the second region for processing the substrate. The showerhead includes gas inlets and gas outlets, the gas inlets supplying the process gas from the first region to the second region and the gas outlets withdraw gas and volatile byproducts from the second region to the third region. The exhaust conduit is in fluid communication with the third region and the gas and volatile byproducts are withdrawn from the process chamber through the exhaust conduit.

According to one embodiment of the invention, each of the gas inlets is concentrically positioned within a respective one of the gas outlets. The gas inlets and gas outlets can be circular with the gas outlets being larger in diameter than the gas inlets. The gas inlets can comprise tubes extending from a plate separating the first region from the second region. The plasma generator can comprise a microwave source which energizes the gas into the plasma state and the showerhead can comprise an electrically insulating material. The showerhead can include a bottom plate separating the second region from the third region with the gas outlets comprising openings in the bottom plate and the tubes extending into the openings. The process chamber can include a substrate support on which the substrate is supported in the second region. The gas delivery conduit can include a gas delivery port opening into a central portion of the first region, the first region including a gas deflection member facing the gas delivery port, the gas deflection member deflecting process gas supplied through the gas delivery conduit such that the process gas is prevented from flowing directly from the gas delivery port through the showerhead gas inlets located in the central portion of the first region. The process chamber can include a pin lift mechanism having lift pins which raise and lower the substrate off of and onto the substrate support and the substrate support can include a heater which maintains the substrate at a desired temperature.

The invention also provides a method of processing a substrate in an apparatus which distributes process gas evenly over a surface of the substrate, the method comprising steps of: supplying process gas to be energized into a plasma state to a plasma generator; energizing the process gas into a plasma state in the plasma generator; withdrawing the process gas from the plasma generator through a gas delivery conduit in fluid communication with the plasma generator; processing a substrate in a process chamber including a first region in fluid communication with the plasma delivery conduit, a second region wherein the substrate is processed, a third region in fluid communication with the second region and through which gas and volatile byproducts are removed from the second region, and a showerhead separating the first and second regions, the showerhead including gas inlets and gas outlets, the gas inlets supplying the process gas from the first region to the second region, the gas outlets withdrawing gas and volatile byproducts from the second region to the third region, the substrate being processed by flowing process gas supplied from the gas delivery conduit into the first region, through the gas inlets into the second region and contacting the surface of the substrate with the process gas; and withdrawing the gas and volatile byproducts from the process chamber through an exhaust conduit in fluid communication with the third region.

According to one embodiment of the method, the plasma generator is located a distance away from the process chamber sufficient to allow ions to recombine with electrons in the plasma gas and such that the process gas contacting the surface of the substrate is a reactive gas essentially free of electrically charged particles which may damage devices on the substrate. The substrate can include a mask of an organic material and the mask is stripped during the step of processing the substrate. Each of the gas inlets can be concentrically positioned within and surrounded by a respective one of the gas outlets, the process gas being supplied to the second region through the gas inlets and flowing directly into contact with the surface of the substrate, gas and volatile byproducts produced by reaction of the process gas and the surface of the substrate flowing directly away from the surface of the substrate and being removed from the second region through the gas outlets without substantial flow of the gas and volatile byproducts laterally across the surface of the substrate. The gas inlets and gas outlets can be circular with the gas outlets larger in diameter than the gas inlets, the process gas being separated into portions of process gas, each portion of process gas flowing into the second region through a respective one of the gas inlets and after reacting with the surface of the substrate flowing through a respective one of the gas outlets surrounding the respective gas inlet.

According to the method, the process chamber can include a substrate support on which the substrate is supported in the third region, the substrate support being larger than the substrate, the second region being within a space defined by a sidewall extending between the substrate support and the showerhead, the method including maintaining the second region at a pressure below 10 torr by applying a vacuum source to the gas outlets. The substrate support can comprise an electrostatic chuck, the substrate being clamped to the electrostatic chuck by applying a voltage to the electrostatic chuck during the step of processing the substrate. The process chamber can include a pin lift mechanism having lift pins, the method including transferring a single substrate into the second region, placing the substrate onto the lift pins, and placing the substrate onto the substrate support by lowering the lift pins. The substrate support can include a heater, the method including maintaining the substrate at a desired temperature by heating the substrate support with the heater.

BRIEF DESCRIPTION OF THE DRAWINGS

The foregoing, and other, objects, features and advantages of the present invention will be more readily understood upon reading the following detailed description in conjunction with the drawings in which:

FIG. 3(a) illustrates a plasma process chamber incorporating a showerhead according to one embodiment of the present invention;

FIG. 3(c) illustrates a three-dimensional view of a portion of the showerhead shown in FIG. 3(a);

FIG. 3(d) illustrates a view of a portion of the bottom plate of the showerhead shown in FIG. 3(a);

FIG. 3(e) is an exemplary depiction of the bottom plate of the showerhead shown in FIG. 3(a)

DETAILED DESCRIPTION OF THE PREFERRED EMBODIMENTS

Figure 1:
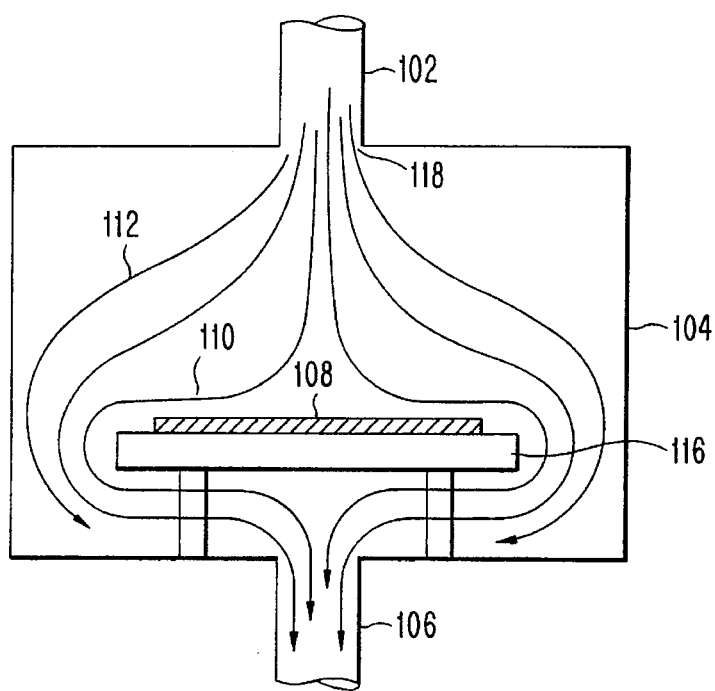
FIG. 1 illustrates a conventional plasma process chamber.
Figure 2:
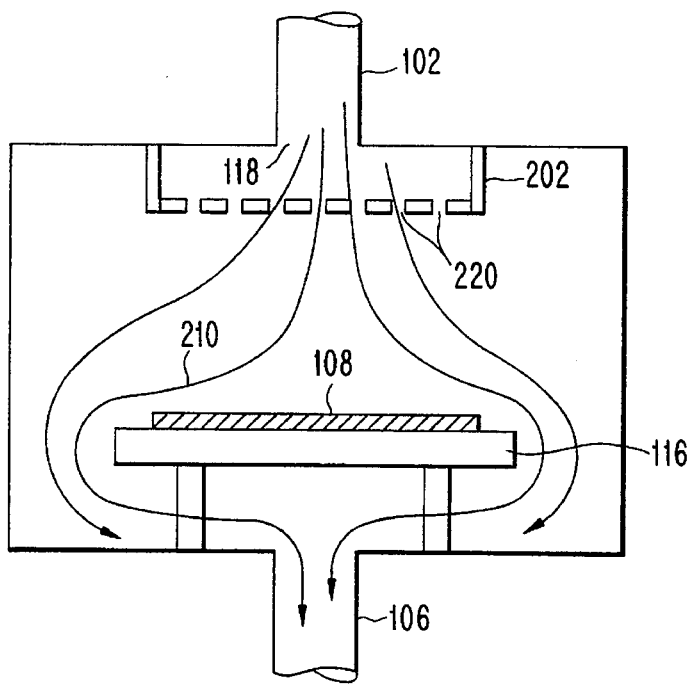
FIG. 2 illustrates a conventional plasma process chamber using a conventional showerhead assembly.

In the following description, for purposes of explanation and not limitation, specific details are set forth in order to provide a thorough understanding of the invention. However, it will be apparent to one of ordinary skill in the art that the present invention may be practiced in other embodiments that depart from these specific details. In other instances, detailed descriptions of well-known methods, devices, and circuits are omitted so as not to obscure the description of the present invention with unnecessary detail.

FIG. 3(a) illustrates a plasma process apparatus according to one embodiment of the invention. The apparatus includes a gas conduit 300 which supplies gas to a microwave plasma generator 302 and conduit 304 for supplying the plasma to a process chamber 333. According to exemplary embodiments of the invention, the plasma generator 302 may be located a suitable distance (e.g., about 12 inches or more) from the process chamber 333 to allow ions to recombine with electrons so that the reactive gas supplied by conduit 304 does not have electrically charged particles by the time the reactive gas enters the process chamber 333.

The process chamber 333 includes a door lift mechanism 306 for opening and closing a door 308 to allow for the entry and removal of semiconductor wafer 108. Once properly positioned, the wafer sits on a platen 326 which is heated in the range of 250° C. to 300° C. to promote chemical etching of a layer on the substrate (e.g., photoresist stripping). The process chamber 333 further includes a lift pin mechanism 310 (such as a pneumatic lift assembly) having a plurality of lift pins 324 (only one of which is shown) for use in raising the wafer 108 for loading and unloading the wafer on a suitable transport device such as a robotic arm. Further, the process chamber 333 includes a temperature measurement device 312 in conjunction with one or more thermocouples 322 for monitoring the temperature of the platen 326 during processing. Specific details of suitable wafer transport, chamber door seals, platen designs, wafer lifting arrangements, platen heating and temperature monitoring devices will be apparent to those skilled in the art.

The process chamber 333 is preferably used for photoresist stripping and can be free of any means for generating plasma or maintaining the reactive gas in an excited state (e.g., in a plasma state). In other words, the process chamber 333 can omit electrodes for creating plasma within the chamber. Instead, process chamber 333 serves only to uniformly distribute the previously excited gases produced in upstream microwave plasma generator 302 to the substrate surface such that the reactive gas is supplied to the substrate in an electrically neutral condition. On the other hand, if process chamber 333 included electrodes to generate or attract the plasma towards the substrate 108, in the case of photoresist stripping, the plasma would have electrically charged particles which could damage or destroy the fine structures etched on the substrate surface.

In operation, the plasma gas generated in microwave plasma generator 302 flows into the chamber through input gas line 300. For instance, for photoresist stripping processing, the input gas can include oxygen, or oxygen in combination with water vapor and/or a fluorinated gas or other suitable gas chemistries. Fluorinated gases can be included in the reactive gas to break through an outer skin of a mask to be removed. For etching or deposition operations, other gas chemistries may be employed and the microwave plasma generator could be omitted in which case plasma could be generated within chamber 333. Depending on the pressure in the chamber and process to be performed, the gas supplied through conduit 304 can be supplied at a rate such as 1 to 5 standard liters per minute.

Once converted to its active ionized state, the gas flows from the microwave plasma generator 302, through delivery conduit 304, into a first region 316 of process chamber 333. The chamber 333 can be maintained at any suitable pressure such as below about 20 torr, preferably below about 10 torr and more preferably below about 5 torr (e.g., 0.1 to 5 torr). For photoresist stripping, the chamber 333 can be maintained at approximately 0.5 to 10 torr (e.g., 0.5 to 5 torr). The region 316 includes dispersion member 314 to prevent a disproportionate amount of reactive gas from passing directly through the orifices of a showerhead 370 in the vicinity of conduit 304. The dispersion member 314 can be used to distribute the reactive gas throughout the region 316. To simplify discussion of the gas flow, a single flow path 330 is shown.

After being deflected by the dispersion member 314, the exemplary gas flowline 330 passes through one of a plurality of input tubes of the showerhead 370. For illustration purposes, exemplary gas flowline 330 is shown passing through input tube 360, which is illustrated in more detail in FIG. 3(b). The gas flows through tube 360 into second region 320 where it reacts at the substrate surface 108 immediately below the opening of tube 360. At this point, byproducts (e.g., due to the reaction of oxygen and photoresist) are immediately pumped into third region 364 of the showerhead, as indicated by exemplary flow line 332. The byproducts flow into region 364 through outlet orifice 362 and are removed from process chamber 333 through exhaust conduit 318, as indicated by exemplary flow line 334. As shown in both FIGS. 3(a) and 3(b), the device chamber 333 includes a plurality of input tubes 360 which uniformly distribute the reactive gas in a similar manner described above with respect to exemplary gas flow lines 330, 332 and 334. Furthermore, the byproducts are withdrawn into an annular space defining exhaust conduit 318 which surrounds the showerhead 370. In order to withdraw the byproducts, exhaust conduit 318 is evacuated by suitable vacuum pumping equipment such as a vacuum pump.

Further details of the three-dimensional inter-relationship between the input tubes and the output orifices are shown FIGS. 3(c–e). For instance, FIG. 3(c) shows the three-dimensional layout of input tubes 390 and 360, which extend through region 364 and lie concentrically within outlet openings 362,392, respectively, located in plate 393.

A portion of the bottom plate 393 of the showerhead (e.g., the surface closest to the semiconductor wafer) has the appearance illustrated in FIG. 3(d). As shown, input tube 360 is concentrically positioned within outlet opening 362 in plate 393 in which the larger diameter outlet openings 362,392 are provided. The centers of the outlet openings are preferably provided in a uniform hexagonal pattern such that the openings form a series of aligned rows and columns which cover the plate 393, as shown in FIG. 3(e). The size of the inlet tubes, outlet openings and spacing therebetween can be chosen for optimal uniformity and etch rate for given reactant gas chemistry, flow rate, and/or process chamber pressure.

The showerhead is preferably constructed of an electrically non-conductive material, such as quartz. In the case of photoresist stripping, quartz is desirable since it provides a low recombination rate of the dissociated oxygen molecules in the process gas. However, the showerhead can be made of any suitable materials such as aluminum, silicon, etc. The showerhead material can be chosen on the basis of performance characteristics such as low particle generation and/or low atomic recombination coefficient. The showerhead bottom plate 393 is preferably located a distance above the substrate surface (e.g., 200 mm wafer) of about the diameter of an input tube. However, the distance between the substrate and plate 393 could be variable by movement of the substrate holder towards and away from the showerhead or vice versa.

The dimensions for various components of the showerhead can vary depending on the substrate size. In the case of processing an 8 inch (200 mm) semiconductor wafer, the inlet tubes can have a diameter of ½ inch. In such a case, approximately 1 standard cm$^3$ sec$^{-1}$ of gas can be supplied through each tube with a pressure drop of less than 10 mtorr. The input tubes can have a length of 1 to 1½ inches, the outlets surrounding the tubes can have a diameter of about ¾ inch, and the tubes can be located on centers spaced apart by about 1 inch.

According to one embodiment of the invention, the showerhead 370 can be removably mounted in the process chamber 333. For instance, showerhead 370 can be provided as an integral unit which attaches to the substrate support 326 or a part of the process chamber by guide members for a slide fit, fasteners such as bolts or any other effective technique.

Figure 3B:
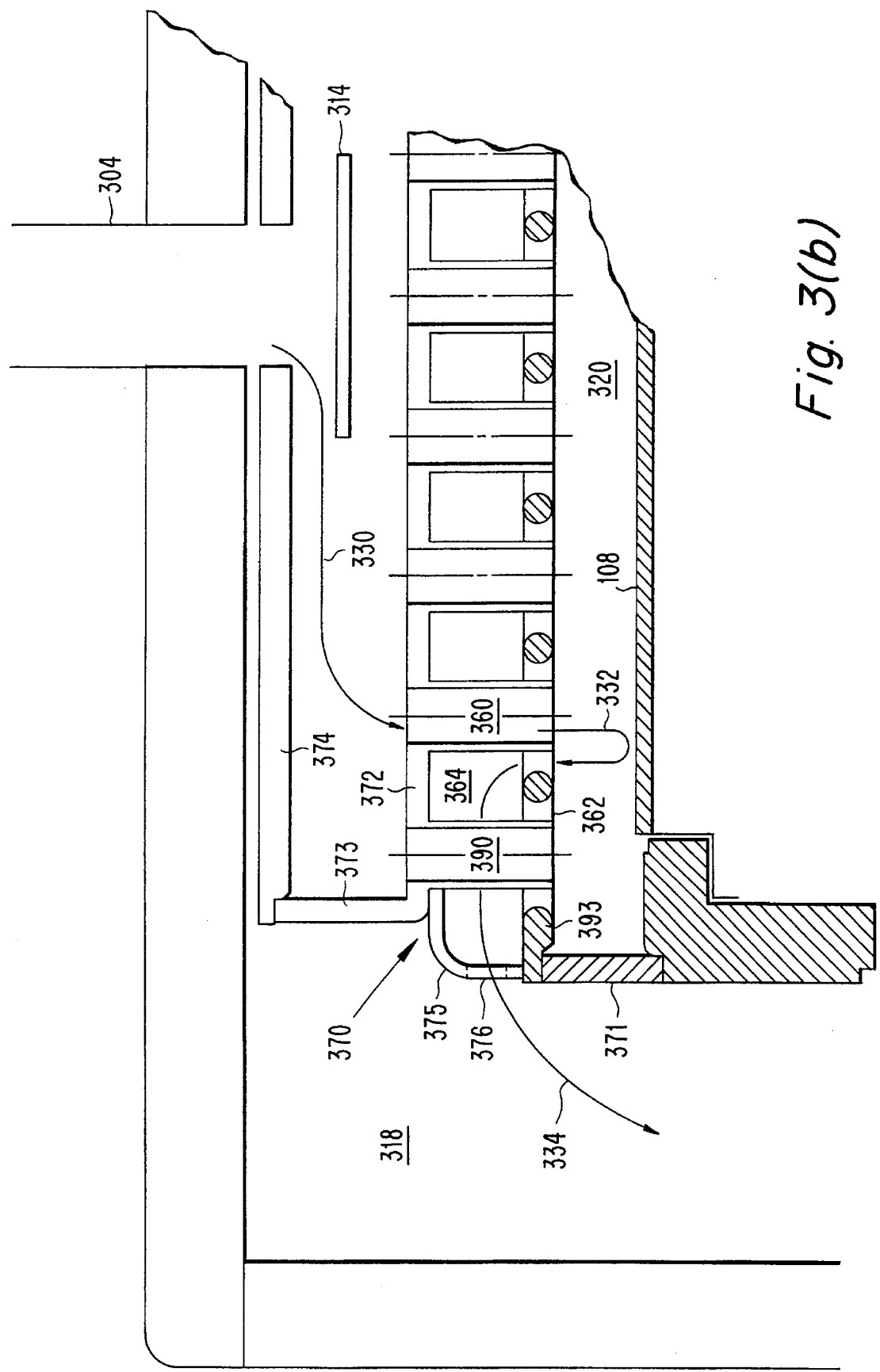
FIG. 3(b) illustrates features of the showerhead shown in FIG. 3(a)

According to another embodiment, the showerhead can be made up of individual pieces which cooperate to form the first, second and third regions. For instance, the showerhead could include a lower ring 371, bottom plate 393, middle plate 372, upper ring 373 and top plate 374, as shown in FIG. 3(b). Middle plate 372 can be held above bottom plate 393 by ring 375. These parts can be stacked together to form substantially vacuum tight first, second and third regions. Ring 375 can include openings 376 which allow gas and byproducts to flow from third region 364 to space 318. The tubes 360 can be flared at upper ends thereof such that the flared ends support the tubes in the openings in middle plate 372. Thus, any tubes which become broken or damaged can easily be replaced. In order to provide access to the interior of the process chamber, the top of the chamber could be hinged or removably attached to the chamber to allow servicing or replacement of the showerhead.

Figure 4A:
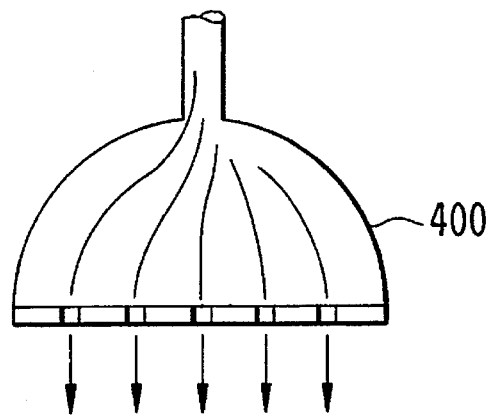
FIGS. 4(a) and 4(b) illustrate alternative embodiments for the design of a gas inlet region usable in combination with the showerhead shown in FIG. 3(a).
Figure 4B:
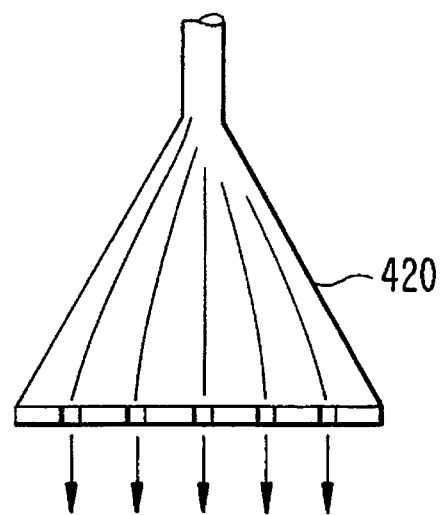

As shown in FIG. 3(a), gas region 316 is shown having parallel top and bottom members. However, gas region 316 can be configured with non-parallel members. For instance, FIG. 4(a) shows a gas region cavity 400 having a curved upper member. FIG. 4(b) shows a gas region cavity 420 having sloping side walls. Such designs offer varying distribution of gases to the plurality of input tubes.

The above-described exemplary embodiments are intended to be illustrative in all respects, rather than restrictive, of the present invention. Thus, the present invention is capable of many variations in detailed implementation that can be derived from the description contained herein by a person skilled in the art. All such variations and modifications are considered to be within the scope and spirit of the present invention as defined by the following claims.

What is claimed is:

1. An apparatus for uniformly distributing process gas over a substrate surface comprising:
    a gas supply conduit supplying process gas to be energized into a plasma state;
    a plasma generator in fluid communication with the gas supply conduit, the plasma generator energizing process gas supplied from the gas supply conduit into a plasma state;
    a gas delivery conduit in fluid communication with the plasma generator, the gas delivery conduit carrying the process gas energized in the plasma generator;
    a process chamber wherein a substrate is processed, the process chamber including a first region in fluid communication with the gas delivery conduit, a second region wherein the substrate is processed, a third region in fluid communication with the second region and through which gas and volatile byproducts are removed from the second region, and a showerhead separating the first and second regions, the process gas supplied from the gas delivery conduit passing into the first region, through the showerhead and into the second region for processing the substrate;
    the showerhead including gas inlets and gas outlets, the gas inlets supplying the process gas from the first region to the second region, the gas outlets withdrawing gas and volatile byproducts from the second region to the third region; and
    an exhaust conduit in fluid communication with the third region, the gas and volatile byproducts being withdrawn from the process chamber through the exhaust conduit.

2. The apparatus of claim 1, wherein each of the gas inlets is concentrically positioned within a respective one of the gas outlets.

3. The apparatus of claim 1, wherein the gas inlets and gas outlets are circular, the gas outlets being larger in diameter than the gas inlets.

4. The apparatus of claim 1, wherein the gas inlets comprise tubes extending from a plate separating the first region from the second region.

5. The apparatus of claim 1, wherein the plasma generator comprises a microwave source which energizes the process gas into the plasma state.

6. The apparatus of claim 1, wherein the showerhead comprises an electrically insulating material.

7. The apparatus of claim 4, wherein the showerhead includes a bottom plate separating the second region from the third region, the gas outlets comprising openings in the bottom plate and the tubes extending into the openings.

8. The apparatus of claim 1, wherein the process chamber includes a substrate support on which the substrate is supported in the second region.

9. The apparatus of claim 1, wherein the gas delivery conduit includes a gas delivery port opening into a central portion of the first region, the first region including a gas deflection member facing the gas delivery port, the gas deflection member deflecting process gas supplied through the gas delivery conduit such that the process gas is prevented from flowing directly from the gas delivery port through the showerhead gas inlets located in the central portion of the first region.

10. The apparatus of claim 8, wherein the process chamber includes a pin lift mechanism having lift pins which raise and lower the substrate off of and onto the substrate support and/or the substrate support includes a heater which maintains the substrate at a desired temperature.

11. The apparatus of claim 1, wherein the plasma generator is located a distance away from the process chamber sufficient to allow ions to recombine with electrons in the excited gas and such that the process gas contacting the surface of the substrate is essentially free of electrically charged particles which would damage the substrate.

12. In an apparatus for uniformly distributing process gas over a substrate surface comprising a gas supply conduit supplying process gas to be energized into a plasma state, a plasma generator in fluid communication with the gas supply conduit, the plasma generator energizing the process gas supplied from the gas supply conduit into a plasma state, a gas delivery conduit in fluid communication with the plasma generator, the gas delivery conduit carrying the process gas energized in the plasma generator, a process chamber wherein a substrate is processed, the process chamber including a first region in fluid communication with the gas delivery conduit, a second region wherein the substrate is processed, and a showerhead separating the first and second regions, the process gas supplied from the gas delivery conduit passing into the first region, through the showerhead and into the second region for processing the substrate, the improvement comprising:
    the showerhead being a removable showerhead having a third region in fluid communication with the second region and through which gas and volatile byproducts are removed from the second region, the showerhead including gas inlets and gas outlets, the gas inlets supplying the process gas from the first region to the second region and the gas outlets withdrawing gas and volatile byproducts from the second region to the third region.

13. The showerhead of claim 12, wherein each of the gas inlets is concentrically positioned within a respective one of the gas outlets.

14. The showerhead of claim 12, wherein the gas inlets and gas outlets are circular, the gas outlets being larger in diameter than the gas inlets.

15. The showerhead of claim 12, wherein the gas inlets comprise tubes extending from a plate separating the first region from the second region.

16. The showerhead of claim 12, wherein the showerhead comprises an electrically insulating material.

17. The showerhead of claim 15, wherein the showerhead includes a bottom plate separating the second region from the third region, the gas outlets comprising openings in the bottom plate and the tubes extending into the openings.

18. A method of processing a substrate in an apparatus which uniformly distributes process gas over a surface of the substrate, the method comprising steps of:

supplying process gas to be energized into a plasma state to a plasma generator;

energizing the process gas into a plasma gas state in the plasma generator;

withdrawing excited process gas from the plasma generator through a gas delivery conduit in fluid communication with the plasma generator;

processing a substrate in a process chamber including a first region in fluid communication with the gas delivery conduit, a second region wherein the substrate is processed, a third region in fluid communication with the second region and through which gas and volatile byproducts are removed from the second region, and a showerhead separating the first and second regions, the showerhead including gas inlets and gas outlets, the gas inlets supplying the process gas from the first region to the second region, the gas outlets withdrawing gas and volatile byproducts from the second region to the third region, the substrate being processed by flowing the process gas supplied from the gas delivery conduit into the first region, through the gas inlets into the second region and contacting the surface of the substrate with the process gas; and withdrawing the gas and volatile byproducts from the process chamber through an exhaust conduit in fluid communication with the third region.

19. The method of claim 18, wherein the plasma generator is located a distance away from the process chamber sufficient to allow ions to recombine with electrons in the excited gas and such that the process gas contacting the surface of the substrate is essentially free of electrically charged particles which would damage the substrate.

20. The method of claim 18, wherein the substrate includes a mask of an organic material and the mask is stripped during the step of processing the substrate.

21. The method of claim 18, wherein each of the gas inlets is concentrically positioned within and surrounded by a respective one of the gas outlets, the process gas being supplied to the second region through the gas inlets and flowing directly into contact with the surface of the substrate, gas and volatile byproducts produced by reaction of the process gas and the surface of the substrate flowing directly away from the surface of the substrate and being removed from the second region through the gas outlets without substantial flow of the gas and volatile byproducts laterally across the surface of the substrate.

22. The method of claim 21, wherein the gas inlets and gas outlets are circular and the gas outlets are larger in diameter than the gas inlets, the process gas being separated into portions of process gas, each portion of process gas flowing into the second region through a respective one of the gas inlets and after reacting with the surface of the substrate flowing through a respective one of the gas outlets surrounding the respective gas inlet.

23. The method of claim 21, wherein the gas inlets comprise tubes extending from a plate separating the first region from the second region, the process gas flowing through the tubes into the second region.

24. The method of claim 21, wherein the plasma generator comprises a microwave source, the plasma gas being generated by the microwave source.

25. The method of claim 21, wherein the showerhead comprises an electrically insulating material, the showerhead being non-electrically powered during the step of processing the substrate.

26. The method of claim 23, wherein the showerhead includes a bottom plate separating the second region from the third region, the gas outlets comprising openings in the bottom plate and the tubes extending into the openings, the process gas entering the second region through the tubes and the gas and volatile byproducts produced as a result of reacting the process gas with the surface of the substrate being removed from the second region through the openings.

27. The method of claim 21, wherein the process chamber includes a substrate support on which the substrate is supported in the second region, the substrate support being larger than the substrate, the second region being within a space defined by a sidewall extending between the substrate support and the showerhead, the method including maintaining the second region at a pressure below 10 torr by applying a vacuum source to the gas outlets.

28. The method of claim 27, wherein the substrate support comprises an electrostatic chuck, the substrate being clamped to the electrostatic chuck by applying a voltage to the electrostatic chuck during the step of processing the substrate.

29. The method of claim 21, wherein the process chamber includes a pin lift mechanism having lift pins, the method including transferring a single substrate into the second region, placing the substrate onto the lift pins, and placing the substrate onto the substrate support by lowering the lift pins.

30. The method of claim 27, wherein the substrate support includes a heater, the method including maintaining the substrate at a desired temperature by heating the substrate support with the heater.

* * * * *